United States Patent
Nagamine et al.

(10) Patent No.: US 9,502,644 B1
(45) Date of Patent: Nov. 22, 2016

(54) METHOD FOR MANUFACTURING MAGNETORESISTIVE DEVICE

(71) Applicant: CANON ANELVA CORPORATION, Kawasaki-shi (JP)

(72) Inventors: Yoshinori Nagamine, Kawasaki (JP); Takeshi Saruya, Kawasaki (JP)

(73) Assignee: CANON ANELVA CORPORATION, Kawasaki-Shi (JP)

( * ) Notice: Subject to any disclaimer, the term of this patent is extended or adjusted under 35 U.S.C. 154(b) by 0 days.

(21) Appl. No.: 15/196,992

(22) Filed: Jun. 29, 2016

Related U.S. Application Data

(63) Continuation of application No. PCT/JP2015/005307, filed on Oct. 21, 2015.

(51) Int. Cl.
| | |
|---|---|
| *H01L 43/08* | (2006.01) |
| *H01L 43/12* | (2006.01) |
| *H01L 43/10* | (2006.01) |
| *H01L 43/02* | (2006.01) |
| *G11B 5/39* | (2006.01) |
| *G01R 33/09* | (2006.01) |

(52) U.S. Cl.
CPC ............ *H01L 43/12* (2013.01); *G01R 33/098* (2013.01); *G11B 5/3909* (2013.01); *H01L 43/02* (2013.01); *H01L 43/08* (2013.01); *H01L 43/10* (2013.01)

(58) Field of Classification Search
CPC ..... H01L 43/08; H01L 43/12; G11B 5/3909; G01R 33/098
See application file for complete search history.

(56) References Cited

U.S. PATENT DOCUMENTS

| | | | |
|---|---|---|---|
| 7,479,394 B2 | 1/2009 | Horng et al. | |
| 7,780,820 B2 | 8/2010 | Zhao et al. | |
| 8,013,408 B2 | 9/2011 | Maehara et al. | |
| 8,202,572 B2 | 6/2012 | Zhao et al. | |
| 8,268,713 B2 | 9/2012 | Yamagishi et al. | |
| 8,337,676 B2 | 12/2012 | Zhao et al. | |
| 8,557,407 B2 | 10/2013 | Zhao et al. | |
| 8,728,830 B2 | 5/2014 | Nishimura | |
| 2007/0264423 A1 | 11/2007 | Miura et al. | |
| 2009/0321246 A1 | 12/2009 | Tsunekawa et al. | |
| 2010/0078310 A1 | 4/2010 | Tsunekawa et al. | |
| 2010/0080894 A1 | 4/2010 | Tsunekawa et al. | |
| 2010/0178528 A1 | 7/2010 | Tsunekawa et al. | |

(Continued)

FOREIGN PATENT DOCUMENTS

| | | |
|---|---|---|
| JP | 2007-142424 A | 6/2007 |
| JP | 2007-173843 A | 7/2007 |

(Continued)

*Primary Examiner* — Amar Movva
(74) *Attorney, Agent, or Firm* — Fitzpatrick, Cella, Harper & Scinto

(57) ABSTRACT

The present invention provides a method for manufacturing a magnetoresistive effect device which can improve the through-put and achieve a high MR ratio. A method for manufacturing a magnetoresistive device according to an embodiment of the present invention includes steps of: forming a first ferromagnetic layer; forming a tunnel barrier layer on the first ferromagnetic layer in a first chamber; and forming a second ferromagnetic layer on the tunnel barrier layer, wherein the step of forming the tunnel barrier layer includes steps of: forming a metal layer on the first ferromagnetic layer; oxidizing the metal layer; and, before the step of forming the second ferromagnetic layer, reducing a pressure inside the first chamber to a predetermined pressure at which the metal layer vaporizes, while keeping a temperature inside the first chamber at a predetermined temperature.

4 Claims, 6 Drawing Sheets

(56) References Cited

U.S. PATENT DOCUMENTS

| | | |
|---|---|---|
| 2011/0143460 A1 | 6/2011 | Tsunekawa et al. |
| 2012/0235258 A1 | 9/2012 | Zhao et al. |
| 2013/0134032 A1 | 5/2013 | Tsunekawa et al. |
| 2016/0005958 A1 | 1/2016 | Seino et al. |

FOREIGN PATENT DOCUMENTS

| | | |
|---|---|---|
| JP | 2007-305768 A | 11/2007 |
| JP | 2011-54873 A | 3/2011 |
| JP | 2012-114442 A | 6/2012 |
| WO | 2011/081203 A1 | 7/2011 |
| WO | 2014/097510 A1 | 6/2014 |

METHOD FOR MANUFACTURING MAGNETORESISTIVE DEVICE

CROSS-REFERENCES TO RELATED APPLICATIONS

This application is a continuation application of International Application No. PCT/JP2015/005307, filed Oct. 21, 2015. The contents of the aforementioned applications are incorporated herein by reference in their entireties.

TECHNICAL FIELD

The present invention relates to a method for manufacturing a magnetoresistive device. Especially, the present invention relates to a method for manufacturing a magnetoresistive device, the method including a step of forming a metal oxide layer by oxidation of a metal layer.

BACKGROUND ART

A tunneling magnetoresistive (TMR) device has a structure in which a tunnel barrier layer is interposed between two ferromagnetic layers. Application of an external magnetic field to the TMR device causes a change in relative angle of magnetization between the two ferromagnetic layers between which the tunnel barrier layer is interposed. This results in change in tunneling conduction probability of electrons through the tunnel barrier layer, and change in resistance of the TMR device. Such TMR devices have been applied to devices such as read-out sensor units of magnetic heads used for hard disks and non-volatile memories utilizing magnetism (MRAMs).

It is known that magnesium oxide (MgO), which is an oxide of magnesium (Mg), is used for a tunnel barrier layer of a TMR device. Known methods for preparing a tunnel barrier layer made of MgO include a method in which the MgO layer is directly formed by high-frequency (RF) sputtering using a MgO target and a method in which an Mg layer is formed and then the MgO layer is formed by an oxidation treatment.

The following methods have been reported for manufacturing a TMR device by using the method in which a Mg layer is formed and then a MgO layer is formed by an oxidation treatment. Specifically, one is a method in which a tunnel barrier layer including a first Mg layer, a MgO layer, and a second Mg layer is formed by, after formation of the first Mg layer, forming the MgO layer on a surface of the Mg layer by natural oxidation, and then forming the second Mg layer (Patent Document 1). Others are a method in which a first Mg layer is formed, followed by an oxidation treatment under high pressure, and then a second Mg layer is formed, followed by an oxidation treatment under low pressure (Patent Document 2), and a method in which a stack of a first MgO layer and a second MgO layer is formed (Patent Documents 3 and 4).

In the method disclosed in Patent Document 3, a tunnel barrier layer including a MgO layer having a crystal orientation is formed by annealing the formed MgO layers in a magnetic field. In the method disclosed in Patent Document 4, a tunnel barrier layer is formed by forming a Mg layer on the first MgO layer, and then raising the temperature to remove unoxidized Mg by vaporization.

CITATION LIST

Patent Documents

Patent Document 1: Japanese Patent Application Laid-Open No. 2007-142424
Patent Document 2: Japanese Patent Application Laid-Open No. 2007-305768
Patent Document 3: Japanese Patent Application Laid-Open No. 2007-173843
Patent Document 4: International Publication No. WO2011-081203

SUMMARY OF INVENTION

Because of fewer particles, the method in which the MgO layer is formed by forming a Mg layer followed by an oxidation treatment is more suitable for mass production than the method based on RF sputtering using a MgO target; however, this method has a problem of low MR ratio. The MR ratios achieved by the methods disclosed in Patent Documents 1 and 3 listed above are 34% and about 60%, respectively. The method of Patent Document 4 can improve the MR ratio, but improvement in through-put has been required.

In this respect, an object of the present invention is to provide a method for manufacturing a magnetoresistive effect device, which includes a step of forming a metal oxide layer (for example, a MgO layer) by an oxidation treatment on a metal layer (for example, a Mg layer), and which can improve the through-put and achieve a high MR ratio.

To achieve the object, a method for manufacturing a magnetoresistive device according to one embodiment of the present invention includes steps of: preparing a substrate on which a first ferromagnetic layer is formed; forming a tunnel barrier layer on the first ferromagnetic layer in a first chamber; and forming a second ferromagnetic layer on the tunnel barrier layer, wherein the step of forming the tunnel barrier layer includes steps of: forming a metal layer on the first ferromagnetic layer; oxidizing the metal layer; and, before the step of forming the second ferromagnetic layer, reducing a pressure inside the first chamber to a pressure at which the metal layer vaporizes, while keeping a temperature inside the first chamber at a predetermined temperature.

The present invention makes it possible to provide a magnetoresistive device with fewer particles and a high MR ratio. The present invention also makes it possible to provide magnetoresistive devices with a good through-put.

DESCRIPTION OF EMBODIMENTS

Figure 1:
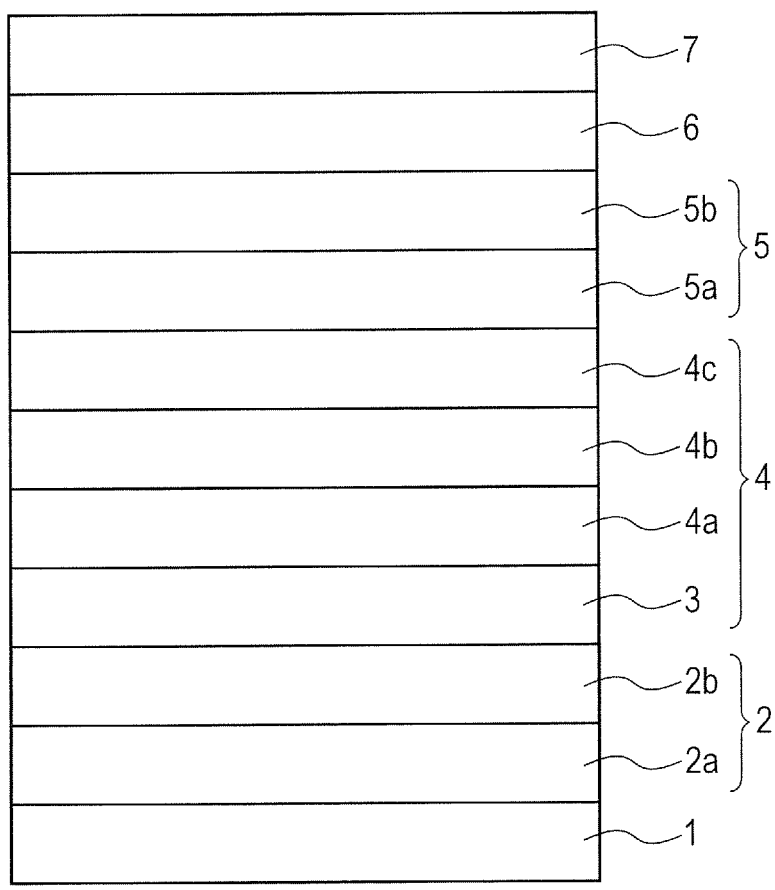
FIG. 1 is a schematic cross-sectional diagram of a TMR device according to an embodiment of the present invention.

Hereinafter, an embodiment of the present invention is described with reference to the drawings; however, the present invention is not limited to the embodiment. Note that, in the drawings described below, members having the same functions are denoted by the same reference numerals, and overlapping descriptions thereof are omitted in some cases.

Embodiment

FIG. 1 is a schematic cross-sectional diagram of a TMR device 10 according to this embodiment. FIG. 1 schematically shows a cross-section of the TMR device 10, and the thicknesses and widths of layers shown in FIG. 1 are different from actual ones. The configuration of the TMR device 10 shown in FIG. 1 is an example, and addition, alteration, and the like of any layer may be conducted, as long as the function of the TMR device 10 can be achieved.

The TMR device 10 includes a substrate 1. An underlayer 2 is formed on the substrate 1. The underlayer 2 includes a first underlayer 2a and a second underlayer 2b formed in this order from a side closer to the substrate 1. The first underlayer 2a is, for example, a layer containing at least one of tantalum (Ta), hafnium (Hf), niobium (Nb), zirconium (Zr), titanium (Ti), molybdenum (Mo), and tungsten (W) and having a thickness of about 0.5 to 5 nm. The second underlayer 2b is, for example, a layer containing at least one of nickel (Ni), iron (Fe), chromium (Cr), and ruthenium (Ru) and having a thickness of about 0.5 to 5 nm. Note that a stack of the first underlayer 2a and the second underlayer 2b is used as the underlayer 2 in this embodiment; however, the underlayer 2 is not limited thereto, but may be a single layer.

A synthetic-type magnetization pinned layer 4 is formed on the underlayer 2. The magnetization pinned layer includes an antiferromagnetic layer 3, a ferromagnetic layer 4a, a non-magnetic intermediate layer 4b, and a ferromagnetic layer 4c, which are formed in this order from the side closer to the substrate 1. The antiferromagnetic layer 3 is, for example, a layer being made of IrMn, PtMn, FeMn, NiMn, RuRhMn, CrPtMn, or the like and having a thickness of about 3 to 15 nm. The ferromagnetic layer 4a is, for example, a layer being made of CoFe or the like and having a thickness of about 1 to 5 nm. The non-magnetic intermediate layer 4b is, for example, a layer being made of at least one of Ru, Cr, rhodium (Rh), iridium (Ir), and rhenium (Re) or an alloy of two or more thereof and having a thickness of about 0.8 nm. The ferromagnetic layer 4c is, for example, a layer being made of CoFe, CoFeB, or the like and having a thickness of about 1 to 5 nm. In this embodiment, the magnetization pinned layer 4 has a four-layer structure of the antiferromagnetic layer 3, the ferromagnetic layer 4a, the non-magnetic intermediate layer 4b, and the ferromagnetic layer 4c. However, the ferromagnetic layers 4a and 4c and the non-magnetic intermediate layer 4b may be replaced with a single ferromagnetic layer. In such a case, the magnetization pinned layer 4 has a double-layer structure of the antiferromagnetic layer 3 and the ferromagnetic layer.

A tunnel barrier layer 5 is formed on the magnetization pinned layer 4. The tunnel barrier layer 5 includes a first metal oxide layer 5a and a second metal oxide layer 5b, which are formed in this order from the side closer to the substrate 1. The first metal oxide layer 5a is formed by forming a first metal layer 5a' (unillustrated) containing predetermined metal atoms on the magnetization pinned layer 4 under heating, and oxidizing the first metal layer 5a' under heating. The first metal layer 5a' has a thickness of about 0.5 nm to 2.0 nm. It is preferable to use magnesium (Mg) for the first metal layer 5a', from the viewpoint of obtaining a high MR ratio. The first metal layer 5a' may be one containing at least Mg. It is also possible to use an alloy formed of zinc (Zn) and aluminum (Al) or an alloy formed of Mg, Zn, and Al for the first metal layer 5a'. Moreover, a metal such as Al, Zn, Ti, Hf, or gallium (Ga) may be used for the first metal layer 5a'. Moreover, oxygen may be added to any of the metals shown as examples for the first metal layer 5a', or at least one non-metal such as boron (B) or carbon (C) may be added thereto.

The second metal oxide layer 5b is formed by using a material and a film formation method which are similar to those for the first metal oxide layer 5a. In this embodiment, a stack of the first metal oxide layer 5a and the second metal oxide layer 5b is used as the tunnel barrier layer 5; however, the tunnel barrier layer 5 is not limited thereto, but the second metal oxide layer 5b may be absent.

A magnetization free layer 6 is formed on the tunnel barrier layer 5. The magnetization free layer 6 is, for example, a ferromagnetic layer being made of at least one layer of CoFe, CoFeB, NiFe, or the like or two or more layers thereof and having a thickness of about 1 to 10 nm. A protective layer 7 is formed on the magnetization free layer 6. The protective layer 7 is, for example, a layer being made of at least one layer of Ta, Ru, Ti, Pt, or the like or two or more layers thereof and having a thickness of about 1 to 30 nm.

The above-described TMR device 10 can be used for a read-out sensor of a magnetic head for a hard disk, a memory cell of an MRAM, or other magnetic sensors.

Figure 2:
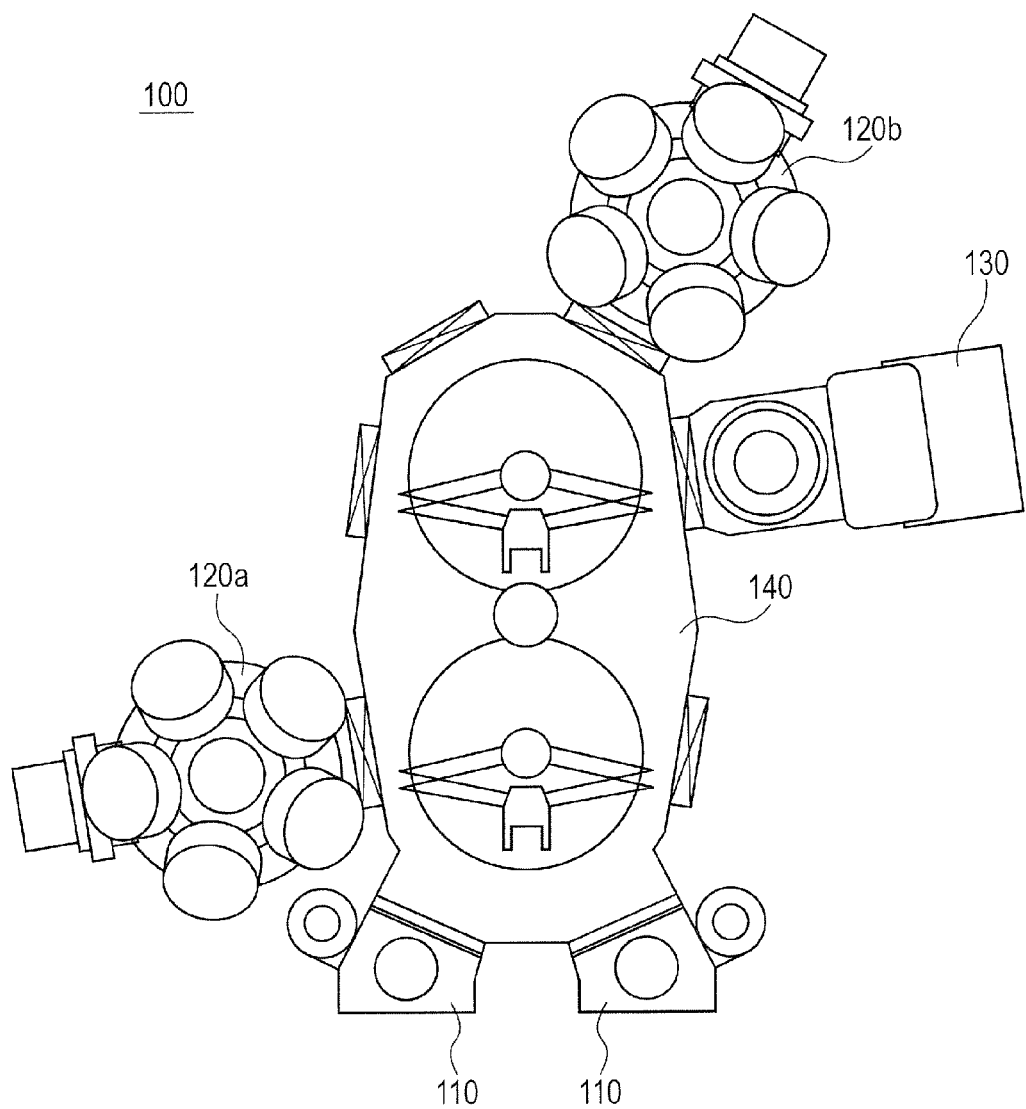
FIG. 2 is a schematic structural diagram of an apparatus for manufacturing a TMR device according to an embodiment of the present invention.

FIG. 2 is a schematic structural diagram of a TMR device-manufacturing apparatus 100 according to this embodiment. The manufacturing apparatus 100 is a cluster-type manufacturing apparatus. For manufacturing the TMR device 10 in this embodiment, the manufacturing apparatus 100 includes at least one film formation chamber, and at least one chamber in which oxidation, heating, and film formation can be carried out (hereinafter, this chamber is referred to as a thermal oxidation chamber).

Specifically, the manufacturing apparatus 100 includes load lock chambers 110, a first film formation chamber 120a, a second film formation chamber 120b, a thermal oxidation chamber 130, and a transfer chamber 140. The load lock chambers 110, the first film formation chamber 120a, the second film formation chamber 120b, and the thermal oxidation chamber 130 are connected to one another via the transfer chamber 140. Each chamber has an evacuation device and can be evacuated independently. This configuration enables a substrate to be treated under vacuum throughout the processes.

Each load lock chamber 110 is a chamber used to transfer the substrate 1 into the manufacturing apparatus 100, and transfer the substrate 1 out of the manufacturing apparatus 100. The first film formation chamber 120a is a chamber used to form layers from the underlayer 2 to the magnetization pinned layer 4 on the substrate 1. The thermal oxidation chamber 130 is a chamber used to form the tunnel barrier layer 5 by performing a heat treatment, an oxygen exposure treatment, a film formation treatment, and a pressure reduction treatment, which are described later, on the substrate 1 on which the magnetization pinned layer 4 has been formed. The second film formation chamber 120b is a chamber used to form layers from the magnetization free layer 6 to the protective layer 7 on the substrate 1 on which the tunnel barrier layer 5 has been formed. The manufacturing apparatus 100 may include any devices such as additional film formation chambers and cooling chambers, in addition to the above-described chambers.

Figure 3:
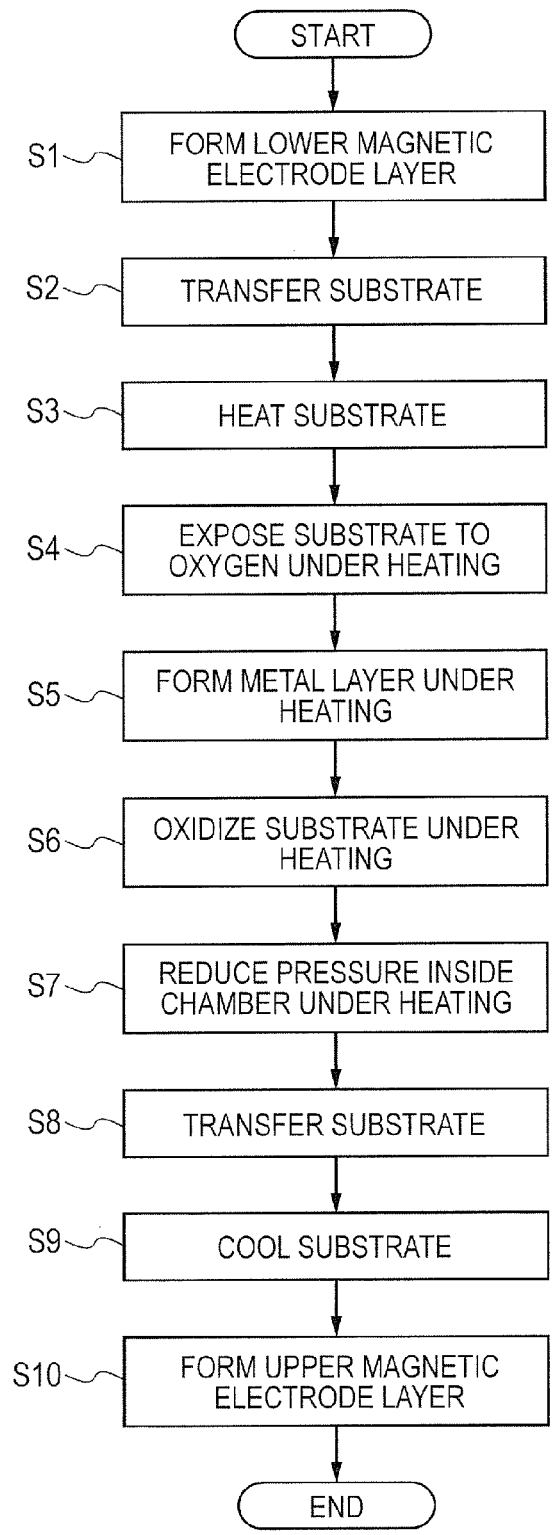
FIG. 3 is a diagram showing a flowchart of a method for manufacturing a TMR device according to the embodiment of the present invention.

FIG. 3 is a diagram showing a flowchart of a method for manufacturing a TMR device according to this embodiment. First, the manufacturing apparatus 100 forms the underlayer 2 and the magnetization pinned layer 4, which serve as a lower magnetic electrode layer, on the substrate 1 in the first film formation chamber 120a (Step S1). Here, the underlayer 2 includes the first underlayer 2a and the second underlayer 2b, and the magnetization pinned layer 4 includes the antiferromagnetic layer 3, the ferromagnetic layer 4a, the non-magnetic intermediate layer 4b, and the ferromagnetic layer 4c.

In this embodiment, the magnetization pinned layer 4 is formed on the substrate 1 in Step S1. Alternatively, a substrate 1 on which the magnetization pinned layer 4 is formed in advance may be used. In other words, in this embodiment, any method can be employed, as long as a substrate having a ferromagnetic layer on which the tunnel barrier layer 5 is to be formed can be fabricated.

Next, the manufacturing apparatus 100 transfers the substrate 1 on which the magnetization pinned layer 4 has been formed to the thermal oxidation chamber 130, which starts to be heated in advance, through the transfer chamber 140 (Step S2). Then, the manufacturing apparatus 100 performs a heat treatment on the substrate 1 in the thermal oxidation chamber 130 (Step S3). During processes of Step S2 and later, the temperature of the substrate 1 is kept constant, until the substrate 1 is transferred out of the thermal oxidation chamber 130. The thermal oxidation chamber 130 heats the substrate 1 to a predetermined temperature (preferably 150 to 400° C.). In the actual raising of the temperature of the substrate 1, the heating may take some time (i.e., there may be a time lag for the substrate 1 to reach a predetermined temperature).

As a method for the heating in the thermal oxidation chamber 130, any method may be used such as a method in which thermal radiation is utilized by using a resistance heater, a lamp heater, or the like or a method in which heat conduction is utilized by placing the substrate 1 directly on a heated stage.

After that, the manufacturing apparatus 100 performs an oxygen exposure treatment in which the surface of the substrate 1 under heating is exposed to oxygen in the thermal oxidation chamber 130 (Step S4). The oxygen exposure treatment is performed with oxygen gas or a mixture gas of oxygen gas and an inert gas. As the inert gas, for example, a gas containing at least one of helium (He), neon (Ne), argon (Ar), krypton (Kr), and xenon (Xe) may be used. The oxidation is performed after heating of the substrate in this embodiment, but a process in which the oxidation is performed during the heating may be employed.

The oxygen exposure treatment is performed by, for example, introducing an oxygen-containing gas into the thermal oxidation chamber 130 during heating, and keeping the pressure in the thermal oxidation chamber 130 at $1\times10^{-5}$ Pa or higher but $1\times10^{-3}$ Pa or lower for 10 seconds or longer but 120 seconds or shorter. By the oxygen exposure treatment, the surface of the magnetization pinned layer 4 is oxidized at least partially. When a material having a higher oxygen affinity than the magnetization pinned layer 4 is used for the first metal layer 5a' formed in the next Step S5, oxygen attached to the surface of the magnetization pinned layer 4 is absorbed by the first metal layer 5a'. Decrease in pressure or oxygen exposure time in the oxygen exposure treatment results in deterioration in uniformity of the first metal layer 5a'. On the other hand, increase in pressure or oxygen exposure time in the oxygen exposure treatment causes excessive oxidation of the magnetization pinned layer 4, which results in increase in RA (device resistance× device area), and decrease in MR ratio. For these reasons, to achieve a good film uniformity and a good MR ratio, the pressure in the oxygen exposure treatment is preferably $1\times10^{-5}$ Pa or higher and $1\times10^{-3}$ Pa or lower, and the time of the oxygen exposure treatment is preferably 10 seconds or longer and 120 seconds or shorter.

After that, the manufacturing apparatus 100 forms the first metal layer 5a' on the substrate 1 exposed to oxygen in the thermal oxidation chamber 130 under heating (Step S5). By the film formation treatment with the substrate 1 being heated, the growth of the film is promoted, and the uniformity of the film can be expected.

After that, the manufacturing apparatus 100 oxidizes the substrate 1, on which the first metal layer 5a' has been formed, in the thermal oxidation chamber 130 under heating (Step S6). The oxidation treatment is performed with oxygen gas or a mixture gas of oxygen gas and an inert gas. As the inert gas, for example, a gas containing at least one of He, Ne, Ar, Kr, and Xe may be used. When a small amount of oxygen is introduced, an inert gas such as Ar is added to keep the pressure inside the thermal oxidation chamber 130 higher than the vapor pressure of the first metal layer 5a'. By performing the oxidation treatment with the substrate 1 being heated, the oxidation speed of the film increases, so that the improvement in through-put and the uniformity of the barrier layer can be expected. When the oxidation speed is excessively high, the amount of oxygen introduced may be reduced. As the oxidation method, any method may be used such as sealed oxidation in which the chamber is sealed, flow oxidation in which the inside of the chamber is being evacuated, radical oxidation using active oxygen, or plasma oxidation.

Figure 4:
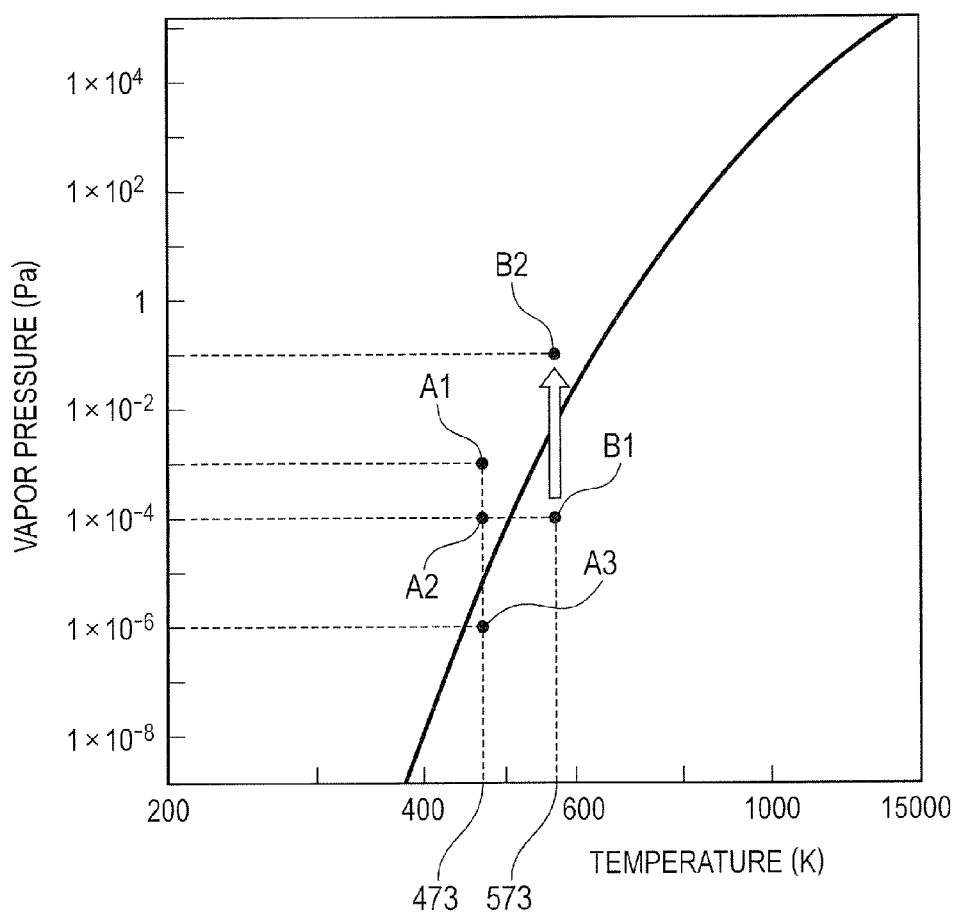
FIG. 4 is a graph showing a vapor pressure curve of Mg.

In the film formation treatment of Step S5 and the oxidation treatment of Step S6, the pressure inside the thermal oxidation chamber 130 is adjusted to be higher than the vapor pressure of the first metal layer 5a' (the Mg layer in this embodiment). FIG. 4 is a diagram showing a vapor pressure curve of Mg. FIG. 4 shows points which indicate the pressures in steps, in addition to the graph of the vapor pressure of Mg. For example, the pressure inside the thermal oxidation chamber 130 is set to a pressure A1 during the formation of the Mg layer (Step S5), and the pressure inside the thermal oxidation chamber 130 is set to a pressure A2 during the oxidation of the Mg layer (Step S6). When the temperature of the substrate 1 is 200° C. (473 K), the pressure A1 and the pressure A2 are higher than the vapor pressure of Mg. For this reason, the Mg layer hardly vaporizes during the formation and oxidation of the Mg layer at a temperature of 200° C.

On the other hand, when the temperature of the substrate 1 is 300° C. (573 K), and the pressure inside the thermal oxidation chamber 130 during the oxidation treatment on the Mg layer (Step S6) is set to a pressure B1, which is equal to the pressure A2 in the case of 200° C., the pressure B1 is lower than the vapor pressure of Mg. For this reason, the Mg layer vaporizes before the oxidation of the Mg layer is sufficiently performed in Step S6.

In this respect, in this embodiment, the inert gas is introduced into the thermal oxidation chamber 130 to adjust the pressure inside the thermal oxidation chamber 130 to a pressure B2, which is higher than the vapor pressure of the metal contained in the first metal layer 5a', during the oxidation of the first metal layer 5a' (Step S6). Specifically, suppose a case where Mg is used for the first metal layer 5a', the pressure inside the thermal oxidation chamber 130 in the oxidation treatment is $1\times10^{-5}$ Pa or higher but $1\times10^{-3}$ Pa or lower, and the temperature of the substrate 1 is 300° C. (573 K). In such a case, the pressure inside the thermal oxidation chamber 130 is the pressure B1, which is not higher than the vapor pressure of Mg. For this reason, Mg vaporizes from the first metal layer 5a'. In this case, both the inert gas and the oxygen gas are added into the thermal oxidation chamber 130 to adjust the pressure inside the thermal oxidation chamber 130 to the pressure B2, which is higher than the vapor pressure of Mg. This makes it possible to suppress the vaporization of the Mg layer, which may occur during the oxidation of the Mg layer. As in the case of the oxidation treatment in Step S6, an inert gas may be introduced in the film formation treatment in Step S5, so that the pressure inside the thermal oxidation chamber 130 can be higher than the vapor pressure of Mg.

Next, the manufacturing apparatus 100 performs, under heating, a pressure reduction treatment in which the introduction of the gases (the oxygen gas and the inert gas) into the thermal oxidation chamber 130 is stopped, and the pressure is reduced to a predetermined pressure by evacuating the inside of the thermal oxidation chamber 130 (Step S7). In Step S7, the pressure inside the thermal oxidation chamber 130 is reduced to the predetermined pressure which is not higher than the vapor pressure of Mg to vaporize non-oxidized solid Mg, which is not bound to oxygen. Here, since the predetermined pressure inside the thermal oxidation chamber 130 is higher than the vapor pressure of MgO, the MgO hardly vaporizes. For this reason, the unoxidized Mg is removed from the first metal layer 5a', and only MgO remains, so that the first metal oxide layer 5a is formed. Next, another set of Steps S5 to S7 is repeated in the same manner as in the formation of the first metal oxide layer 5a to form and then oxidize a second metal layer 5b'. Thus, the second metal oxide layer 5b is formed.

Note that, to obtain a high RA, a tunnel barrier layer 5 including multiple metal oxide layers (here, the first metal oxide layer 5a and the second metal oxide layer 5b) is formed by repeating the set of Steps S5 to S7 multiple times. On the other hand, to obtain a low RA, Steps S5 to S7 are performed only once to form a tunnel barrier layer 5 including only the first metal oxide layer 5a. In other words, the present invention can be applied also to a TMR device not including the second metal oxide layer 5b. In such a case, the tunnel barrier layer 5 has only the first metal oxide layer 5a. In the following description, at least one of the first metal layer 5a' and the second metal layer 5b', which are to be the tunnel barrier layer 5, is simply referred to as a metal layer.

In addition, also when a metal other than Mg is used for the first and second metal layers 5a' and 5b', a pressure at which the first and second metal layers 5a' and 5b' vaporize but the first and second metal oxide layers 5a and 5b do not vaporize can be obtained according to the setting temperature on the basis of a temperature dependence of the vapor pressure as shown in FIG. 4. The pressure reduction treatment in Step S7 may be performed by using the pressure thus obtained.

In Steps S5 to S7, the tunnel barrier layer 5 having the first metal oxide layer 5a and the second metal oxide layer 5b is formed in the same single thermal oxidation chamber 130, as described above. Since the four types of processes, namely, the heat treatment, the oxidation treatment, the film formation treatment, and the pressure reduction treatment are performed in the same single chamber, no time is taken to transfer the substrate during these processes. In other words, the through-put can be improved greatly.

Next, the manufacturing apparatus 100 transfers the substrate 1, which has been subjected to the pressure reduction treatment in Step S7, to a cooling chamber through the transfer chamber 140 (Step S8). In the cooling chamber, the substrate 1 is cooled to 150° C. or below. The substrate 1 may be cooled in a chamber (the first film formation chamber 120a, the second film formation chamber 120b, or the thermal oxidation chamber 130) in which film formation is performed.

The manufacturing apparatus 100 transfers the substrate 1, which has been cooled in Step S9, to the second film formation chamber 120b thorough the transfer chamber 140. Then, the manufacturing apparatus 100 forms the magnetization free layer 6 and the protective layer 7, serving as an upper magnetic electrode layer, on the substrate 1, which has been cooled in Step S9, in the second film formation chamber 120b (Step S10).

Note that when the substrate 1 is transferred from the thermal oxidation chamber 130 to another chamber (for example, the second film formation chamber 120b) thorough the transfer chamber 140, the pressure inside the transfer chamber 140 (transfer pressure) is preferably set to be equal to a predetermined pressure of the thermal oxidation chamber 130 (the pressure at the completion of Step S7). In other words, by setting the pressure inside the transfer chamber 140 to the predetermined pressure, a gate valve between the thermal oxidation chamber 130 and the transfer chamber 140 can be opened immediately after completion of Step S7, so that the transfer time can be shortened.

Three examples including processes in which a metal layer was formed and then a metal oxide layer was formed by oxidation treatment according to the embodiment described above are described by using process time charts.

Example 1

Figure 5:
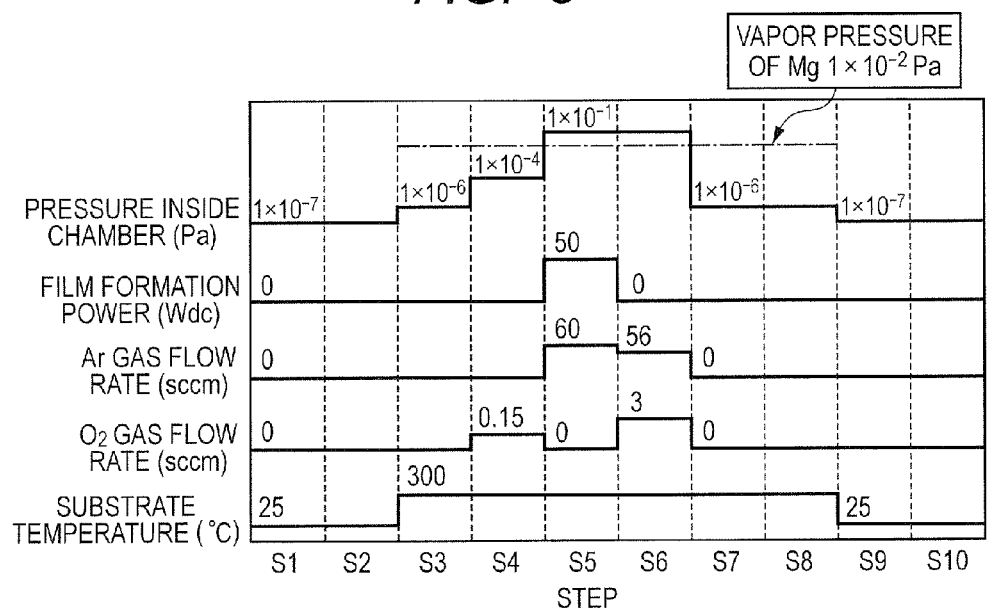
FIG. 5 is a diagram showing a process time chart according to Example 1 of the present invention.

FIG. 5 is a diagram showing a process time chart according to this example. The process time chart in FIG. 5 shows how items including the pressure inside the thermal oxidation chamber 130, the film formation power, the Ar gas flow rate, the oxygen gas flow rate, and the temperature of the substrate 1 change in the steps in FIG. 3. Numbers shown in the process time chart of FIG. 5 shows the values of these items. Since the process time chart of FIG. 5 schematically shows the changes of these items, the changes are discontinuous between steps. Actually, each of the items may be changed continuously (for example, gradually increased or decreased).

In this example, the tunnel barrier layer 5 had only the first metal oxide layer 5a, and Mg was used for the first metal layer 5a', which was to be the first metal oxide layer 5a. In other words, no second metal oxide layer 5b was formed. The temperature to which the substrate 1 was heated in the thermal oxidation chamber 130 was 300° C. (573 K).

After formation of the magnetization pinned layer 4 on the substrate 1, the substrate 1 was transferred to the thermal oxidation chamber 130, and subjected to a heat treatment. In the heat treatment, heat was generated by a resistance heater to heat the substrate 1 by radiation. The temperature of the substrate 1 was approximately 300° C. After the temperature of the substrate 1 reached 300° C., an oxygen exposure treatment was performed for 20 seconds, with the oxygen gas flow rate being set to 0.15 sccm, and the pressure inside the thermal oxidation chamber 130 being set to $1 \times 10^{-4}$ Pa. Next, the first metal layer 5a' was formed with the pressure inside the thermal oxidation chamber 130 being set to $1 \times 10^{-1}$ Pa, which was higher than the vapor pressure ($1\times10^{-2}$ Pa) of Mg at 300° C. (the dashed-dotted line in FIG. 5) on the basis of the vapor pressure curve of FIG. 4.

Next, for performing an oxidation treatment, a small amount of oxygen gas at a flow rate of 3 sccm was introduced. For this reason, if the oxygen gas alone was introduced, the pressure inside the thermal oxidation chamber 130 would be not higher than the vapor pressure of Mg, and Mg might have vaporized during the oxidation treatment. In other words, the solid Mg in the first metal layer 5a' would be converted directly to gaseous Mg during the oxidation treatment. To prevent this vaporization, Ar gas, which was an inert gas, was added to the oxygen gas, and the oxidation treatment was performed for 500 seconds. This made it possible to adjust the pressure inside the thermal oxidation chamber 130 to a pressure higher than the vapor pressure of Mg, and to suppress the vaporization of Mg during the oxidation treatment.

After the oxidation treatment, a pressure reduction treatment was conducted to reduce the pressure inside the thermal oxidation chamber 130 to a predetermined pressure which was not higher than the vapor pressure of Mg but was higher than the vapor pressure of MgO. Here, unoxidized Mg, which was not bound to oxygen, was vaporized, and only MgO remained on the substrate 1. After the pressure reduction treatment, the substrate 1 was transferred to a cooling chamber, where the substrate was cooled. After the substrate 1 was cooled to 150° C. or below, the magnetization free layer 6 was formed on the substrate 1.

Figure 6:
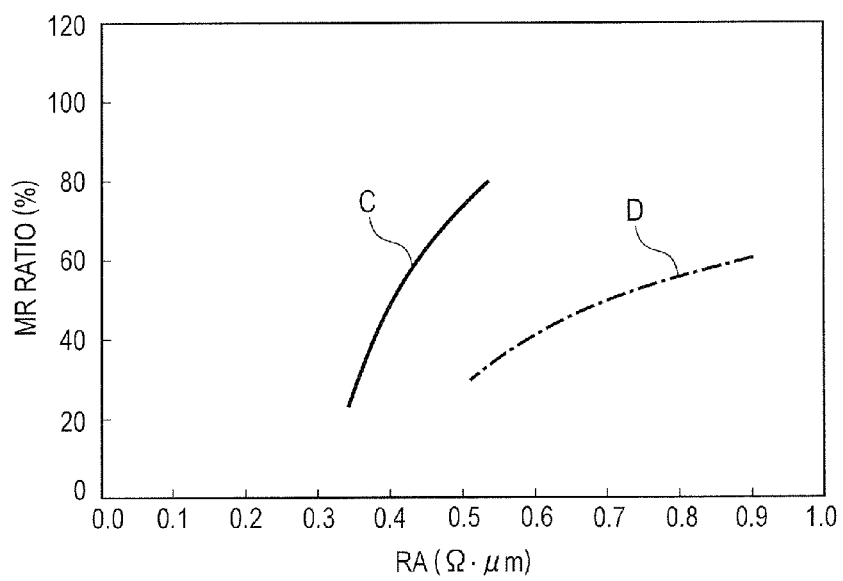
FIG. 6 is a diagram showing a graph of MR ratio of TMR devices according to Example 1 and Comparative Example.

FIG. 6 is a diagram showing a graph of the MR ratios of TMR devices according to this example and Comparative Example. The RA and the MR ratio of a TMR device fabricated by using the treatments of Example 1 were measured. In addition, as Comparative Example, the RA and the MR ratio of a TMR device fabricated by the same treatments of Example 1, except that the Mg vaporization treatment was not performed in the formation of the tunnel barrier layer 5 were measured. FIG. 6 shows a graph C of Example 1 by the solid line, and a graph D of Comparative Example by the dashed-dotted line. From FIG. 6, it can be seen that the TMR device fabricated by using the treatments of Example 1 was lower in RA and higher in MR ratio than the TMR device of Comparative Example.

Example 2

Figure 7:
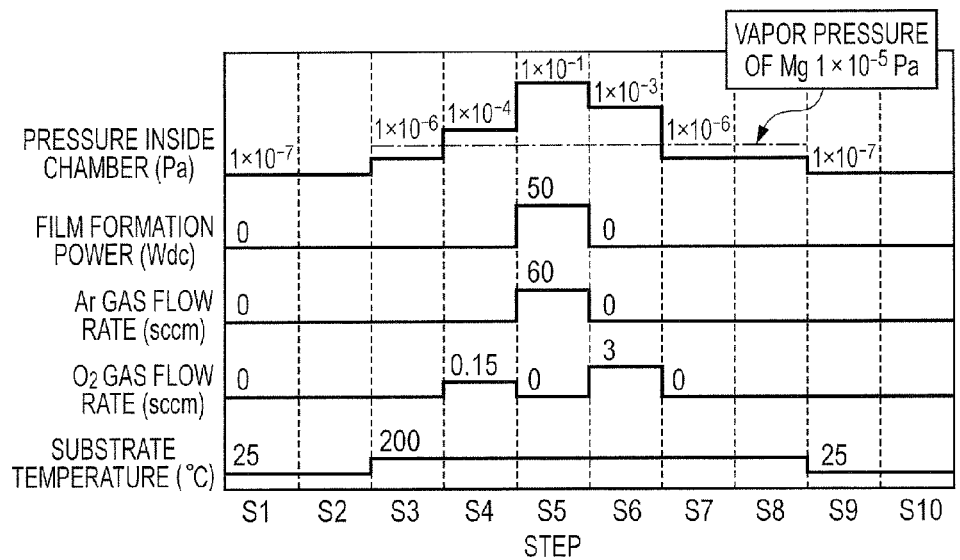
FIG. 7 is a diagram showing a process time chart according to Example 2 of the present invention.

FIG. 7 is a diagram showing a process time chart according to this example. The contents shown in the process time chart of FIG. 7 are the same as those in FIG. 5. In this example, the tunnel barrier layer 5 had the first metal oxide layer 5a alone, and Mg was used for the first metal layer 5a', which was to be the first metal oxide layer 5a. In other words, no second metal oxide layer 5b was formed. The temperature to which the substrate 1 was heated in the thermal oxidation chamber 130 was 200° C. (473 K).

After the magnetization pinned layer 4 was formed on the substrate 1, the substrate 1 was transferred to the thermal oxidation chamber 130, and was subjected to a heat treatment. In the heat treatment, heat was generated by a resistance heater to heat the substrate 1 by radiation. The temperature of the substrate 1 was approximately 200° C. After the temperature of the substrate 1 reached 200° C., an oxygen exposure treatment was performed for 20 seconds, with the oxygen gas flow rate being set to 0.15 sccm, and the pressure inside the thermal oxidation chamber 130 being set to $1\times10^{-4}$ Pa. Next, the first metal layer 5a' was formed, with the pressure inside the thermal oxidation chamber 130 being set to $1\times10^{-1}$ Pa, which was higher than the vapor pressure ($1\times10^{-5}$ Pa) of Mg at 200° C. (the dashed-dotted line in FIG. 7), on the basis of the vapor pressure curve of FIG. 4.

Next, an oxidation treatment was performed, while only oxygen gas was introduced into the thermal oxidation chamber 130 in contrast to Example 1. Here, since the vapor pressure of Mg was lower in the case where the temperature of the substrate 1 was 200° C. than in the case where the temperature was 300° C., it was not necessary to adjust the pressure inside the thermal oxidation chamber 130 by adding Ar gas. After the oxidation treatment, a pressure reduction treatment was performed to adjust the pressure inside the thermal oxidation chamber 130 to a predetermined pressure which was not higher than the vapor pressure of Mg but was higher than the vapor pressure of MgO. Here, unoxidized Mg, which was not bound to oxygen, was vaporized, and only MgO remained on the substrate 1. After the pressure reduction treatment, the substrate 1 was transferred to the cooling chamber, where the substrate 1 was cooled. After the substrate 1 was cooled to 150° C. or below, the magnetization free layer 6 was formed on the substrate 1. Also in this example, a TMR device having a low RA and a high MR ratio, which were at the same levels as those in Example 1, were obtained.

Example 3

Figure 8:
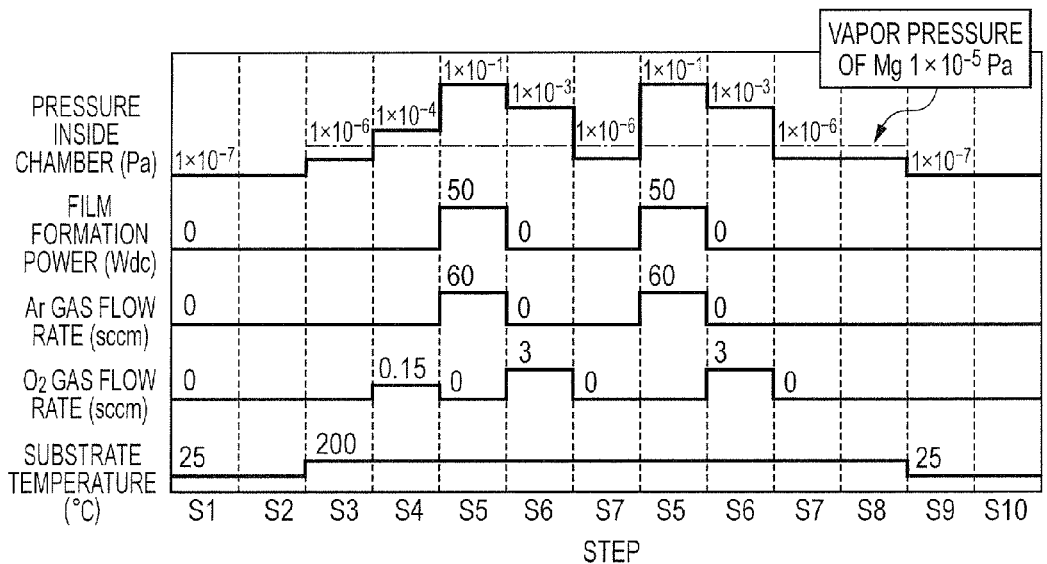
FIG. 8 is a diagram showing a process time chart according to Example 3 of the present invention.

FIG. 8 is a diagram showing a process time chart according to this example. The contents shown in the process time chart of FIG. 8 are the same as those in FIG. 5. In this example, the tunnel barrier layer 5 had the first metal oxide layer 5a and the second metal oxide layer 5b, and Mg was used for the first and second metal layers 5a' and 5b', which were to be the first and second metal oxide layers 5a and 5b. The temperature to which the substrate 1 was heated in the thermal oxidation chamber 130 was 200° C. (473 K).

After the formation of the magnetization pinned layer 4 on the substrate 1, the substrate 1 was transferred to the thermal oxidation chamber 130, and was subjected to a heat treatment. In the heat treatment, heat was generated by a resistance heater to heat the substrate 1 by radiation. The temperature of the substrate 1 was approximately 200° C. After the temperature of the substrate 1 reached 200° C., an oxygen exposure treatment was performed for 20 seconds, with the oxygen gas flow rate being set to 0.15 sccm, and the pressure inside the thermal oxidation chamber 130 being set to $1\times10^{-4}$ Pa. Next, the first metal layer 5a' was formed, while the pressure inside the thermal oxidation chamber 130 was set to $1\times10^{-1}$ Pa, which was higher than the vapor pressure ($1\times10^{-5}$ Pa) of Mg at 200° C. (the dashed-dotted line in FIG. 8) on the basis of the vapor pressure curve of FIG. 4.

Next, an oxidation treatment was performed, while only oxygen gas was introduced into the thermal oxidation chamber 130 in contrast to Example 1. Here, since the vapor pressure of Mg was lower in the case where the temperature of the substrate 1 was 200° C. than in the case where the temperature was 300° C., it was not necessary to adjust the pressure inside the thermal oxidation chamber 130 by adding Ar gas. After the oxidation treatment, a pressure reduction treatment was performed to adjust the pressure inside the thermal oxidation chamber 130 to a predetermined pressure which was not higher than the vapor pressure of Mg but was higher than the vapor pressure of MgO. Here, unoxidized Mg, which was not bound to oxygen, was vaporized, and only MgO remained on the substrate 1.

After the pressure reduction treatment, the second metal layer 5b' was formed on the first metal oxide layer 5a, from which the unoxidized Mg had been vaporized and on which only MgO had remained. After formation of the second metal layer 5b', an oxidation treatment was performed in the same manner as for the first metal layer 5a'. After the oxidation treatment, a pressure reduction treatment was performed to adjust the pressure inside the thermal oxidation chamber 130 to a predetermined pressure which was not higher than the vapor pressure of Mg but was higher than the vapor pressure of MgO. Here, unoxidized Mg, which was not bound to oxygen, was vaporized, and only MgO remained on the substrate 1. After the pressure reduction treatment, the substrate 1 was transferred to the cooling chamber, where the substrate 1 was cooled. After the substrate 1 was cooled to 150° C. or below, the magnetization free layer 6 was formed on the substrate 1. Since the thickness of the tunnel barrier layer 5 was larger in this example where the tunnel barrier layer 5 had a double-layer structure of the first metal oxide layer 5a and the second metal oxide layer 5b than in Examples 1 and 2 where the tunnel barrier layer 5 had a single-layer structure, a TMR device having a high RA and a high MR ratio was obtained in this example.

The above-described method makes it possible to provide a method for manufacturing a magnetoresistive effect device with a high MR ratio, and to improve the through-put because it is not necessary to change the temperature of the substrate during the thermal oxidation process treatment.

Note that, in the description of the embodiment and examples above, the positions of the magnetization free layer 6 and the magnetization pinned layer 4 are limited to specific positions; however, the positions of the magnetization free layer 6 and the magnetization pinned layer 4 are not limited to specific ones in the present invention. In other words, the magnetization free layer 6 may be formed on the lower side (the side close to the substrate 1) of the tunnel barrier layer 5, and the magnetization pinned layer 4 may be formed on the upper side of the tunnel barrier layer 5 (the side distant from the substrate 1).

The present invention is not limited to the above-described embodiment, but can be modified, as appropriate, within a range not departing from the gist of the present invention.

The invention claimed is:

1. A method for manufacturing a magnetoresistive device, comprising steps of:
    preparing a substrate on which a first ferromagnetic layer is formed;
    forming a tunnel barrier layer on the first ferromagnetic layer in a first chamber; and
    forming a second ferromagnetic layer on the tunnel barrier layer, wherein
    the step of forming the tunnel barrier layer includes steps of:
        forming a metal layer on the first ferromagnetic layer;
        oxidizing the metal layer; and
        before the step of forming the second ferromagnetic layer, reducing a pressure inside the first chamber to a predetermined pressure at which the metal layer vaporizes, while keeping a temperature inside the first chamber at a predetermined temperature.

2. The method for manufacturing a magnetoresistive device according to claim 1, wherein
    the step of forming the metal layer and the step of oxidizing the metal layer are performed at the predetermined temperature.

3. The method for manufacturing a magnetoresistive device according to claim 1, wherein
    the step of forming the second ferromagnetic layer is performed in a second chamber, which is different from the first chamber,
    after the step of forming the tunnel barrier layer and before the step of forming the second ferromagnetic layer, the substrate is transferred from the first chamber to the second chamber through a transfer chamber, and
    the predetermined pressure is equal to a pressure inside the transfer chamber.

4. The method for manufacturing a magnetoresistive device according to claim 1, wherein
    the metal layer includes first and second metal layers, and at least one of the first and second metal layers contains magnesium.

* * * * *